United States Patent [19]
Dubs et al.

[11] Patent Number: 6,123,814
[45] Date of Patent: Sep. 26, 2000

[54] COATING STATION

[75] Inventors: Martin Dubs, Maienfeld, Switzerland; Roman Schertler, Wolfurt, Austria; Gregor Strasser, Vaduz, Liechtenstein

[73] Assignee: Balzers Aktiengesellschaft, Fuerstentum, Liechtenstein

[21] Appl. No.: 09/238,060

[22] Filed: Jan. 27, 1999

Related U.S. Application Data

[62] Division of application No. 08/625,315, Apr. 1, 1996, Pat. No. 5,911,861.

[30] Foreign Application Priority Data

Mar. 31, 1995 [DE] Germany ................ 295 05 497 U

[51] Int. Cl.[7] .................................................. C23C 14/34
[52] U.S. Cl. .................. 204/192.26; 204/192.27; 204/192.12; 204/298.27; 204/298.28; 204/298.29; 204/298.15; 204/192.28
[58] Field of Search ................ 204/192.12, 192.26, 204/192.27, 192.28, 298.27, 298.28, 298.29, 298.15

[56] References Cited

U.S. PATENT DOCUMENTS

| 3,889,632 | 6/1975 | Brunner et al. ................ 118/730 |
| 4,851,095 | 7/1989 | Scobey et al. ................ 204/298.27 |
| 5,074,246 | 12/1991 | Gailiard et al. ................ 118/730 |
| 5,292,417 | 3/1994 | Kugler ................ 204/192.13 |
| 5,525,199 | 6/1996 | Scobey ................ 204/298.27 |

FOREIGN PATENT DOCUMENTS

| 0564789 | 10/1993 | European Pat. Off. . |
| 63-065069 | 3/1988 | Japan . |
| 6-49637 | 2/1994 | Japan ................ 204/298.28 |
| 63-22538 | 11/1994 | Japan . |

*Primary Examiner*—Rodney McDonald
*Attorney, Agent, or Firm*—Evenson, Mckeown, Edwards & Lenahan, P.L.L.C.

[57] ABSTRACT

A coating station has a flat sputter source opposite a workpiece receiving arrangement is configured as a planet arrangement. The rotating axes ($A_P$) of the planets intersect one another on a rotating axis ($A_S$) of the sun system on the side facing away from the sputter source. As a result, substrates, particularly optical lenses, can be coated in extremely small batches according to given formulas in an advantageously flexible manner.

23 Claims, 7 Drawing Sheets

COATING STATION

This application is a divisional of application Ser. No. 08/625,315, filed Apr. 1, 1996 now U.S. Pat. No. 5,911,861.

BACKGROUND AND SUMMARY OF THE INVENTION

The present invention relates to a coating system, and more particularly, to a coating station having a coating source and an oppositely situated workpiece carrier arrangement which has planet receiving devices for at least one respective workpiece centered with respect to the planet axis.

It is known to apply thin layers on substrates with different radii of curvature, as particularly to optical or ophthalmic lenses, by thermal vaporizing, electron beam vaporizing or by sputter coating, thus particularly by planar magnetrons. Planar magnetron sputtering is a coating process which has proven its excellent suitability for the automated individual substrate coating in numerous applications, as, for example, for CD-coating or for semiconductor manufacturing.

In the known case, a plurality of substrates are coated simultaneously as so-called "batches". The batch sizes vary from ten substrates to several hundred substrates. Often, as particularly in the manufacturing of ophthalmic lenses where different lens materials (glass types and plastics) must be treated with different coating formulas, this is a considerable disadvantage because, in each case, a sufficient number of substrates with the same coating formula must be collected in order to complete a batch.

In the past, single or multi-layer systems have been applied as optical coatings, for example, with changing refraction indices. Customary materials for this purpose are, in particular, dielectric materials such as $SiO_2$, $Si_3N_4$, etc. That is, especially in the case of optical or ophthalmic lenses, the variety of formulas is very large.

Systems for evaporation coating are generally large and complex which sometimes results in economic operation only with large batches.

In addition, optical and ophthalmic lenses may have very different positive or negative curvatures. Even in this case, optically effective coatings on such lenses must have a very uniform layer thickness distribution, with fluctuations typically being in the range of ±1%. With known evaporation process batch systems, this is achieved by arranging the substrates, that is, the lenses, at a large distance from the evaporation source on calotte-shell-shaped concave substrate carriers where the coating particles virtually everywhere impact on the areas to be coated at a right angle. For the individual coating or the coating of lenses in pairs, such an approach is not very suitable. Furthermore, it cannot be easily automated.

"Thin Film Processes", John L. Vossen, et al., Academic Press, Inc., page 147, describes the process of arranging lenses for coating thereof opposite a planar magnetron, specifically on a workpiece carrier planet arrangement in the case of which the lenses are rotated centrically with respect to the respective planet axes and revolve simultaneously with the sun system.

With respect to a revolving or planet arrangement, everything revolving only about the central axis of the system—the sun system axis—is called the "sun system" in the following. The "planetary system" revolves about the central axis as well as about one planet axis respectively.

The workpiece carrier planet arrangement or the substrate deposited thereon open up a surface which faces the sputter source area in a concave manner. The sputter source acts essentially as a point source into the calotte shell. Because of the calotte shell shape of the workpiece carrier planet arrangement and the respective centric magnetron arrangement, workpiece areas situated centrically closest to the sun system axis have identical shortest distances to the magnetron surface, such as workpiece and substrate areas passing through on the extreme outside with respect to the sun system axis.

This coating technique, which is schematically shown in the above-mentioned document, has the disadvantage that the achievable layer thickness distribution does not meet the above-mentioned requirements.

In "Planetary System for High Uniformity Deposited Layers on Large Substrates", A. Perrin, et al., *SPIE* Vol. 1782, "Thin Films for Optical Systems" (1992), pp 238–244, the coating of large substrates (φ 300 mm) by a vaporization source (crucible) operating in a punctiform manner is described. For a good layer thickness distribution, a substrate carrier planet arrangement is convexly placed against the vaporization source which is shifted with respect to the sun system axis. The distance perpendicularly between the vaporization surface and the rotational centers of the planets is larger than the diameter of the sun system.

The disadvantage of this known approach is the decentralized position of the vaporization source which has the result that the vaporization rate varies with the rotary frequency of the sun system and the vaporization process is therefore relatively poorly utilized. In addition, the corresponding system is relatively voluminous because the required punctiformity of the source is ensured only in the case of the above-mentioned relatively large distance between the source and the moving path of the substrates on the planets.

It is an object of the present invention to provide a coating station by way of which a small number of substrates with a surface, which is arbitrarily curved within wide limits and is to be coated, can be coated as economically as possible, specifically with a good layer thickness distribution within wide limits also independently of the operating duration of the source. In this case, the station should be as compact as possible and the process should be easily implementable.

The foregoing objects have been achieved by providing a station in which the coating source is a flat sputter source having an area centered at least in one dimension thereof with respect to a sun system axis, and the planet arrangement and the sputter source are configured such that a shortest distance between a workpiece area which is outermost with respect to the sun system axis and a new surface of the sputter source is larger than a shortest distance between a workpiece area which is innermost with respect to the sun system axis and the new surface of the sputter source.

BRIEF DESCRIPTION OF THE DRAWINGS

These and other objects, features and advantages of the present invention will become more readily apparent from the following detailed description thereof when taken in conjunction with the accompanying drawings wherein.

DETAILED DESCRIPTION OF THE DRAWINGS

Figure 1:
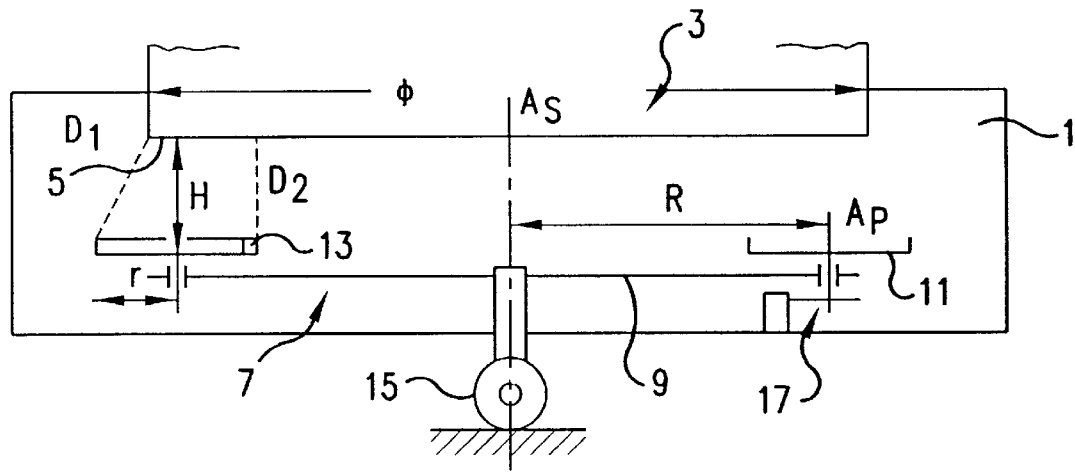
FIG. 1 is a schematic view of a first embodiment of the station according to the present invention.

FIG. 1 is a schematic view of a sputter coating station 1, with a, for example, planar sputter source 3, as particularly with a planar magnetron. In a new condition, i.e., as a new surface, the sputter surface 5 of the source 3 is an extended area which, in the illustrated embodiment, is essentially planar but which, of course, may have other configurations. A workpiece carrier planet arrangement 7 is arranged opposite the sputter surface 5. In FIG. 1, the following symbols represent the following respective features:

$A_S$ is the axis of rotation of the sun system 9;

$A_P$ are the axes of rotation of the planetary system 11;

R is the radius between axis $A_S$ of the sun system and axes $A_P$ of the planets 11;

H is the distance of the planet centers from the new surface 5; and r is the largest radius defined by substrates 13 arranged centrically or center-symmetrically on the planets of the planetary system 11.

If the sputter surface is circular, it is arranged in a centered manner with respect to the axis $A_S$. If the sputter surface is, for example, rectangular or oval, it is centered with respect to the axis $A_S$ in at least one of its dimensional directions.

The workpiece carrier planet arrangement 7 is driven by a drive mechanism 15 which is arranged outside the station 1 and operatively acts upon the sun system 9. As a result and as illustrated schematically at reference numeral 17, the planets of the planetary system 11, by a friction drive or a gear drive, are caused to rotate with respect to the stationary station wall about the rotating axes $A_P$ of the planetary system 11.

The planets each have a workpiece carrier arrangement on which preferably one substrate 13 is held centrically with respect to the planet axis $A_P$. If more than one substrate is arranged on each planet, the substrates are arranged center-symmetrically to the axis $A_P$. In the latter case, the extent of the height H indicates the distance of the central support point for the substrates 13 on the planets 11 from the new surface 5 of the sputter source. In addition, φ indicates the diameter of the sputter source which is preferably circular but may also have other shapes and therefore different diametrical measurements.

According to the embodiment of FIG. 1, at least in significant sections of the sputter surface circumference, in the case of a circular source surface along the entire circumference, the measurement (R+r) is larger than φ/2. As a result, it is achieved in accordance with the present invention that the shortest distance $D_1$ between workpiece areas passing through on the extreme outside with respect to the axis $A_S$ and the sputter source surface 5 is larger than the shortest distance $D_2$ between workpiece areas passing through in the extreme inside with respect to the axis of the sun system $A_S$.

Figure 2:
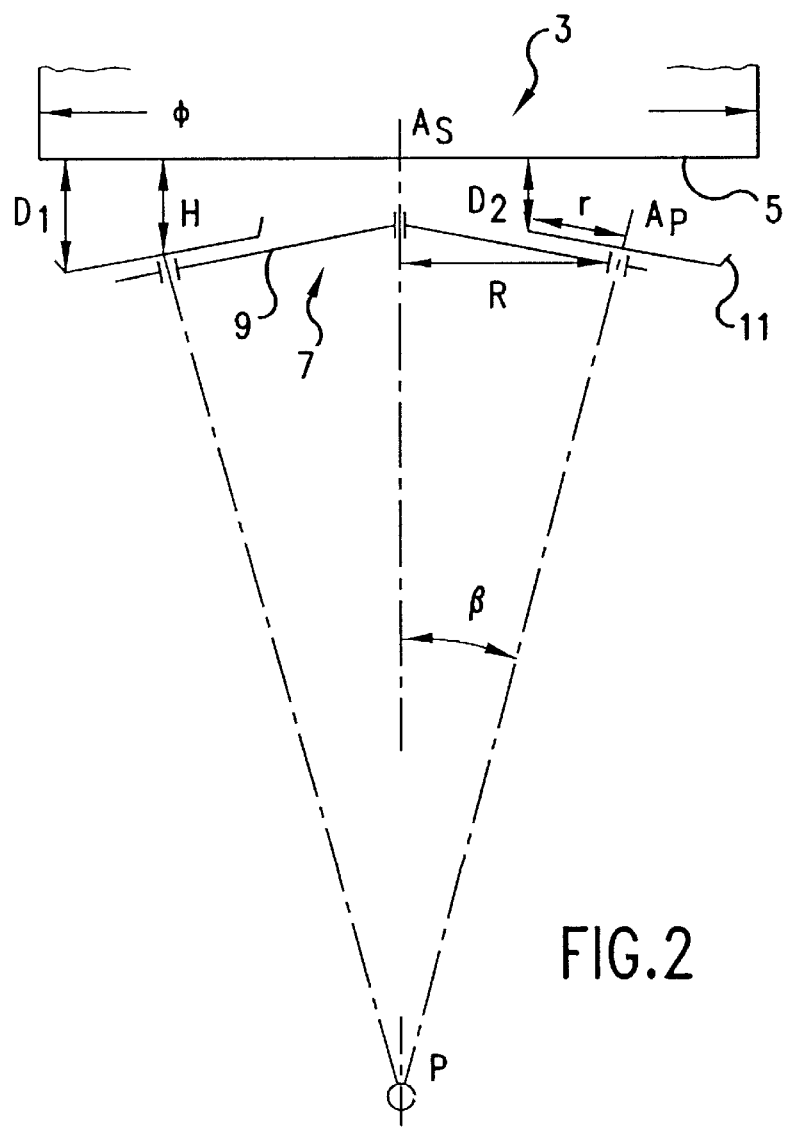
FIG. 2 is a view similar to that of FIG. 1 but of a second preferred embodiment of the station according to the present invention.

FIG. 2 illustrates the preferred arrangement of the sputter source 3 with the new surface 5 and the workpiece carrier planet arrangement 7. For reasons of clarity, only the important elements are entered here and the same reference numerals are selected as in FIG. 1 to designate similar features.

In contrast to the embodiment according to FIG. 1, however, the preferred embodiment according to FIG. 2 provides that the measurement (R+r) is essentially as large as half the diameter φ along at least significant areas of the sputter surface circumference, but may also be smaller. In contrast, the axes $A_S$ and $A_P$ are no longer parallel but intersect one another in a point P which, with respect to the planet arrangement, is situated on the opposite side of the sputter source 3. As a result, the planet arrangement is convex. The distance relationships according to the invention are maintained by the selection of the angle β.

The following measurements are preferably used:

H: 50 mm to 100 mm, preferably approximately 65 mm;

β: 10° to 25°, preferably approximately 15°.

Ratio R to radius r for workpiece receiving devices arranged on the planets in a centric manner: ≧2, preferably approximately 1.5.

These quantities, particularly the low height H and the small ratio R/r, show that the coating station according to the present invention is extremely compact, is constructed in a simple manner of a few parts, and therefore has a height reliability and a favorable utilization of the coating material.

A magnetron is preferably used as a sputter source which is driven by a DC-, AC- or mixed AC-DC-source, as disclosed, for example, as a chopper operation in European Patent Document EP-A-0 564 789, corresponding to U.S. application Ser. No. 08/300,865, which are incorporated by reference herein.

Furthermore, the coating process may, for example, be reactive or take place in the metallic mode or in the so-called "intramode", for the purpose of which reference is made to European Patent Document EP-A-0 508 359, corresponding to U.S. Pat. No. 5,292,417, which is also incorporated by reference herein.

REFERENCE EXAMPLE

By way of a station according to FIG. 2, however, with planets whose axes $A_P$ intersected the sun system axis $A_S$ on the sputter source side at 15°, and therefore with a workpiece carrier arrangement, as known from the aforementioned John L. Vossen, et al. article, specifically concavely calotte-shaped lens surfaces with different radii and curvatures were coated with $SiO_2$ by a planary magnetron as the sputter source 3. The following measurements apply to this example:

| H: | 65 mm; | r: | | 40 mm |
|---|---|---|---|---|
| R: | 65 mm; | Curvature Kr. of Substrates: | | 0 |
| β: | +15°; | φ: | | 125 mm |

Figure 3A:
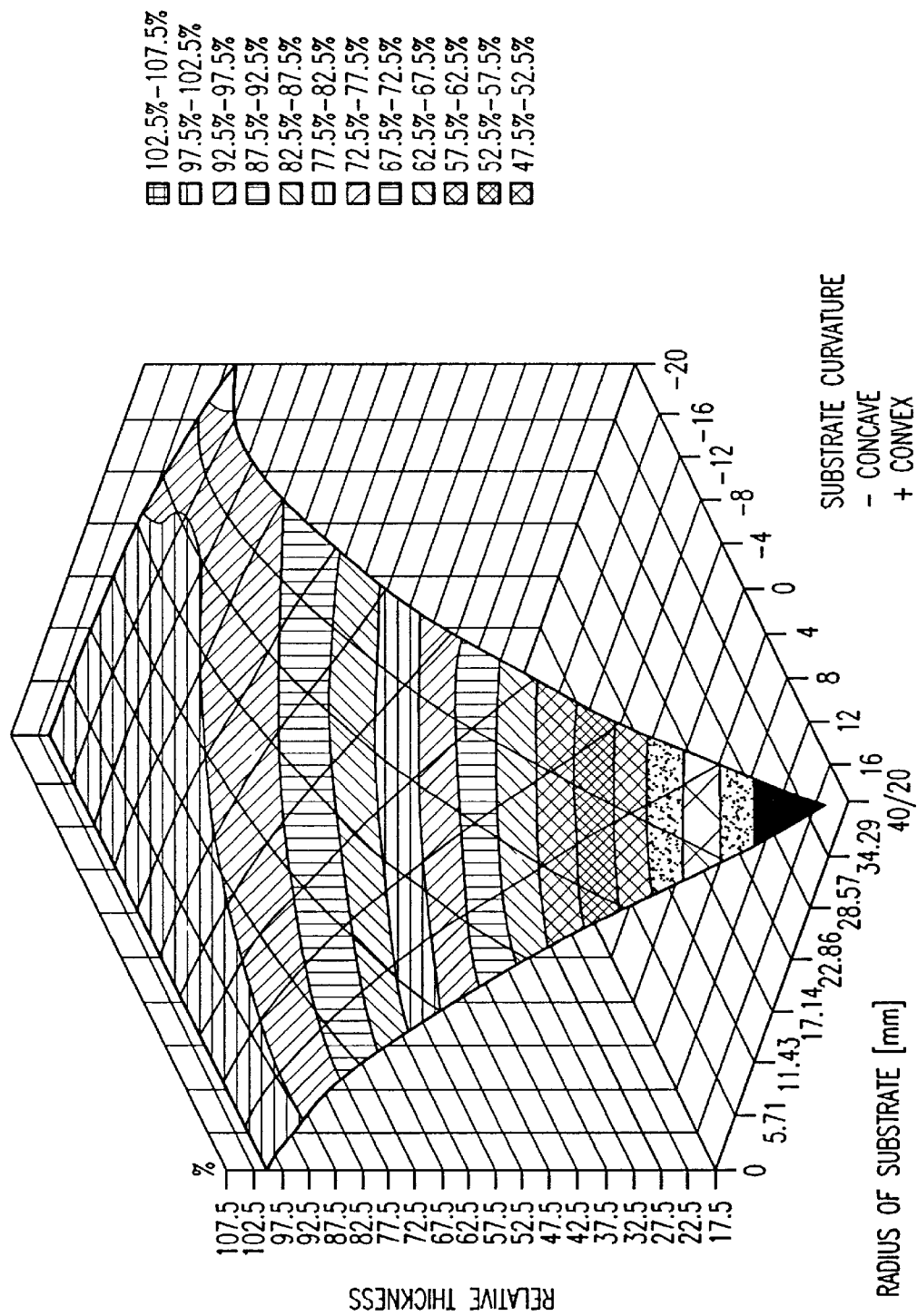
FIG. 3a is a coating thickness distribution diagram for an arrangement with a concave workpiece planet arrangement essentially as discussed in the aforementioned "Thin Film Processes" article of John L. Vossen, et al., as a function of the substrate radius and substrate curvature of the coated surface.
Figure 3B:
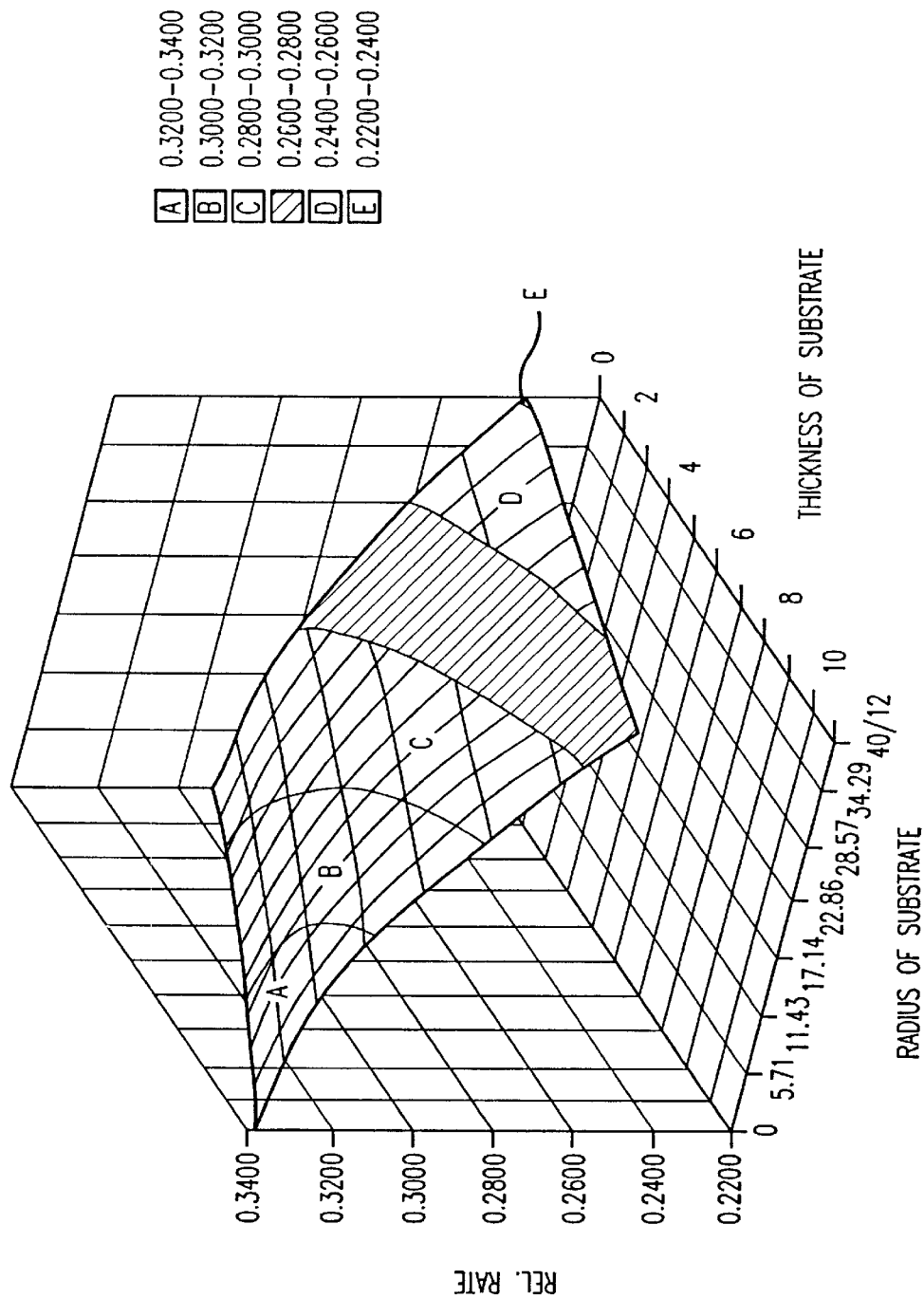
FIG. 3b is a coating rate distribution diagram for the concave planet arrangement as a function of the substrate radius and the substrate thickness (plane substrates)

FIG. 3a shows on one hand, the relative coating thickness in percent, as a function of the variable radius size r' (in mm)

of the coated lens bodies, which were deposited centrically with respect to the planet axis $A_P$ on the planet lens carriers. Furthermore, the relative layer thickness is also indicated as a function of the lens curvature in 1/m, in which case minus curvatures of the magnetron surface indicate facing concave lens surfaces; positive curvatures indicate lens surfaces which are convex in this respect. FIG. 3b illustrates the relative coating rate on the substrates as a function of the variable radius size r' and of the substrate thickness.

The distributions implemented in the following according to the present invention corresponding to Example 1 and 2 will now be compared with the distributions as a reference example implemented according to prior art.

Example 1

As illustrated schematically according to FIG. 1, via a station, lens bodies which, in turn, are centrically held with respect to the planet axes $A_P$ and have surfaces to be coated in a different manner convexly and concavely were coated as in the reference example with the following dimensions:

| H: | 65 mm; | r: | 40 mm |
|---|---|---|---|
| R: | 84 mm; | Kr.: | varied |
| β: | 0° | φ: | 125 mm |

The coating process was carried out by the same adjusting parameters and the same magnetron as in the reference example.

Figure 4A:
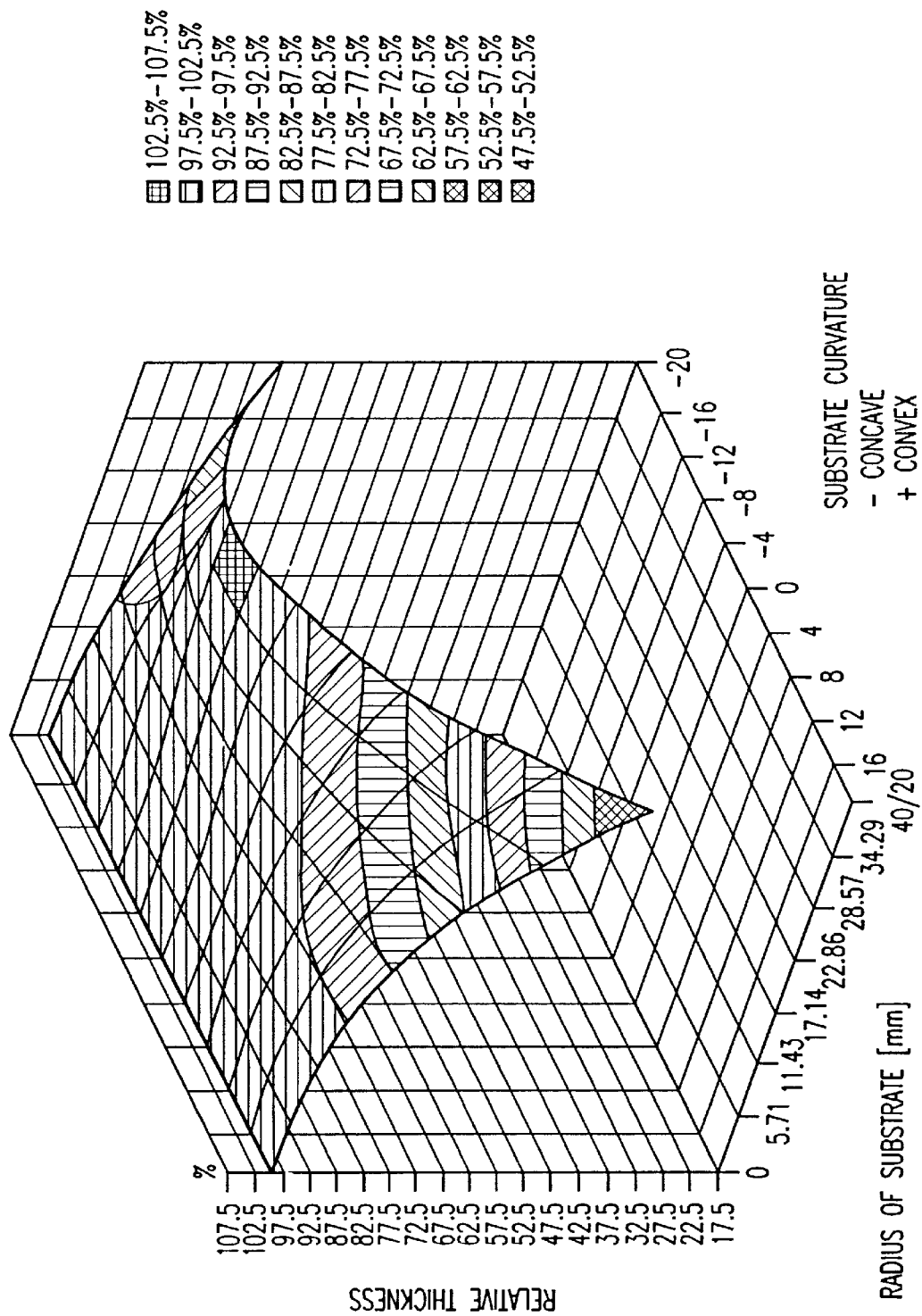
FIG. 4a is a diagram similar to that of FIG. 3a of the conditions during coating by a station as illustrated schematically in FIG. 1.
Figure 4B:
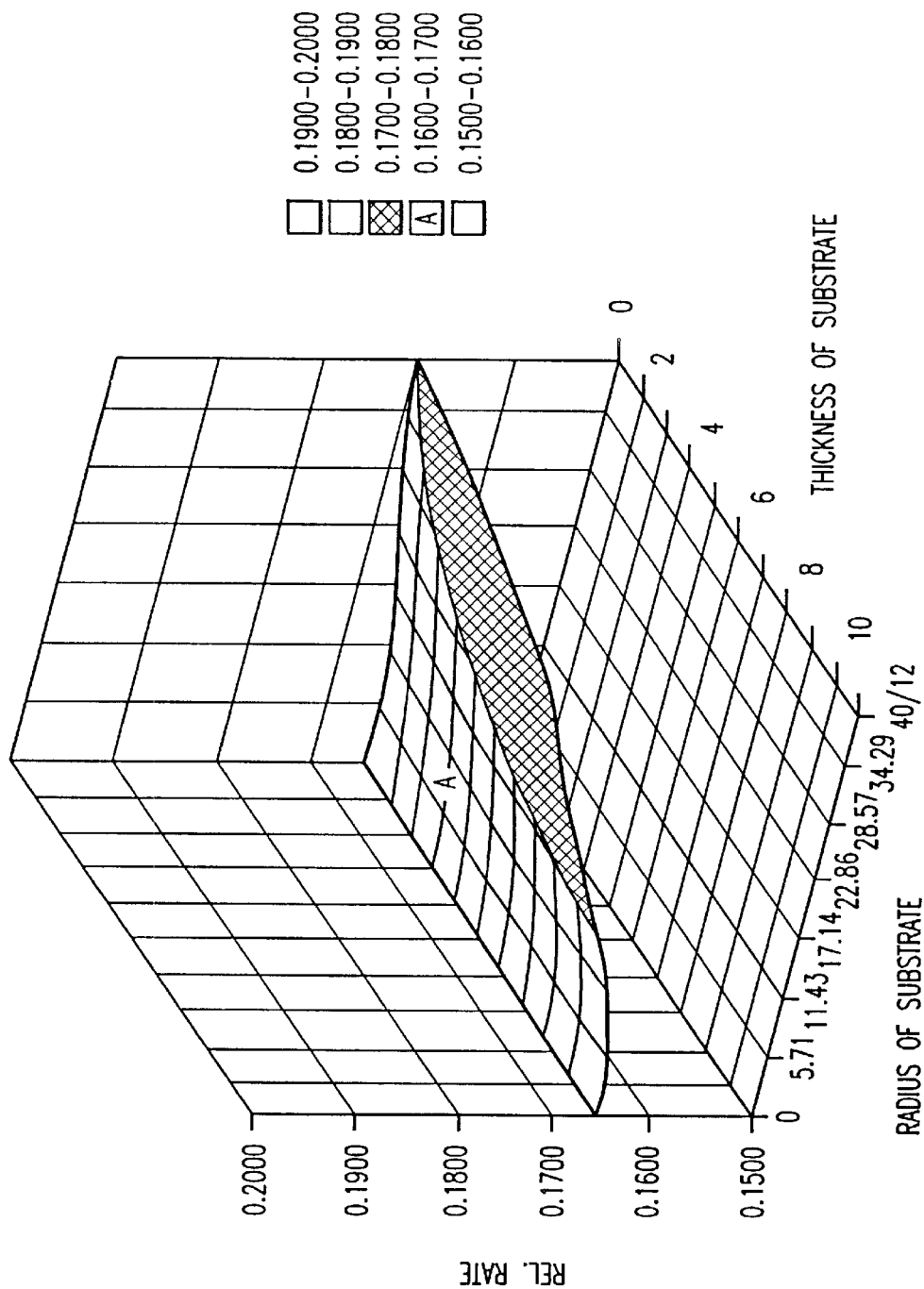
FIG. 4b is a diagram similar to that of FIG. 3b of the conditions during coating by the station according to the invention corresponding to FIG. 1.

The results are indicated in FIG. 4a analogously to FIG. 3a, and in FIG. 4b analogously to FIG. 3b, wherein for the conditions according to FIG. 4b, the substrate curvature Kr. equals 0.

Example 2

Differently convex or concave lens bodies were coated completely identically but with the construction of the workpiece carrier planet arrangement according to FIG. 2. Here also, the coating process was carried out in the same manner as in the reference example.

The following measurements apply:

| Height: | 65 mm; | r: | 40 mm |
|---|---|---|---|
| R: | 65 mm; | Kr.: | varied |
| β: | −15° | φ: | 125 mm |

(intersecting point as in FIG. 2).

Figure 5A:
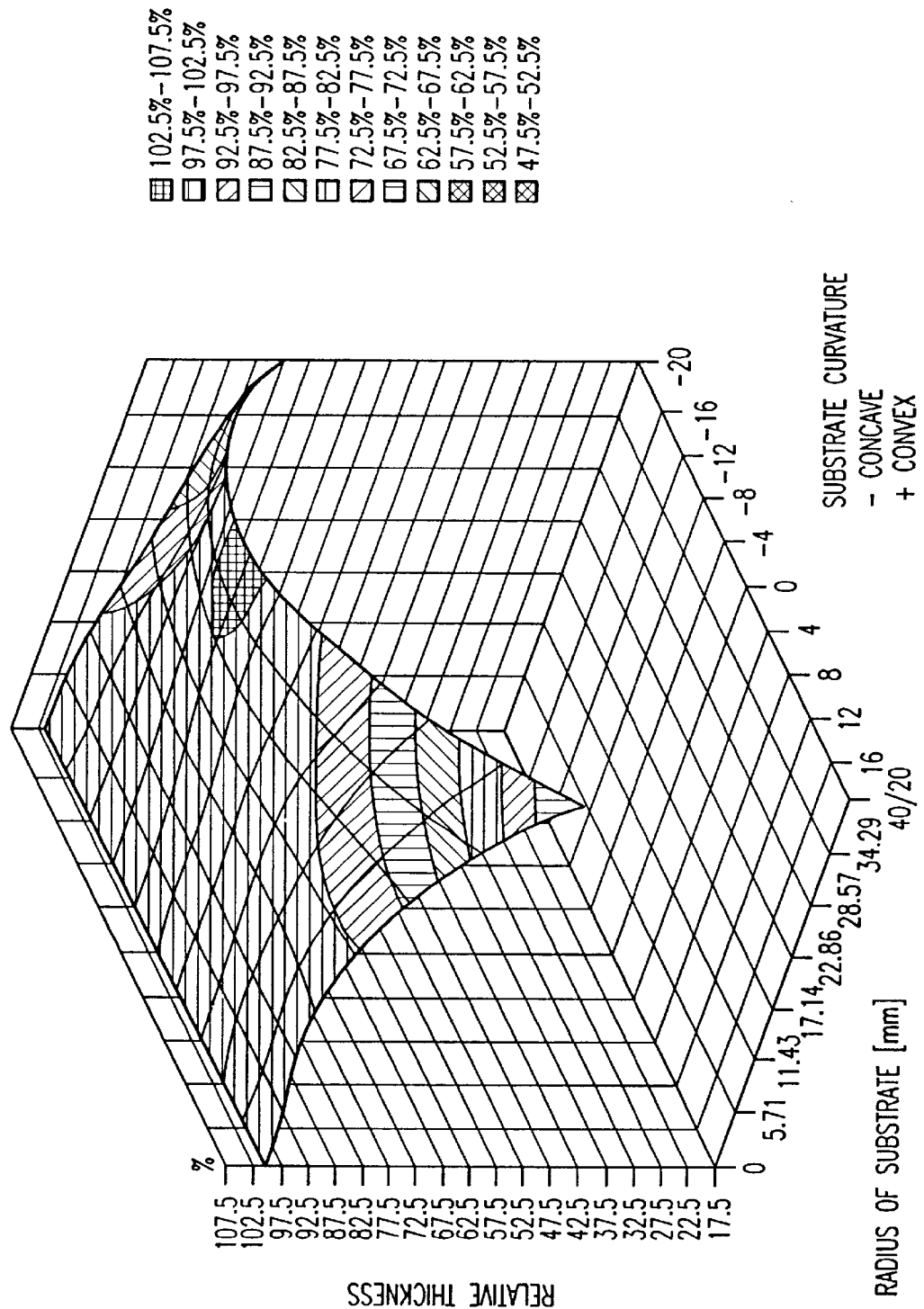
FIG. 5a is a diagram similar to that of FIG. 4a of the conditions during coating by a station as illustrated schematically in FIG. 2.
Figure 5B:
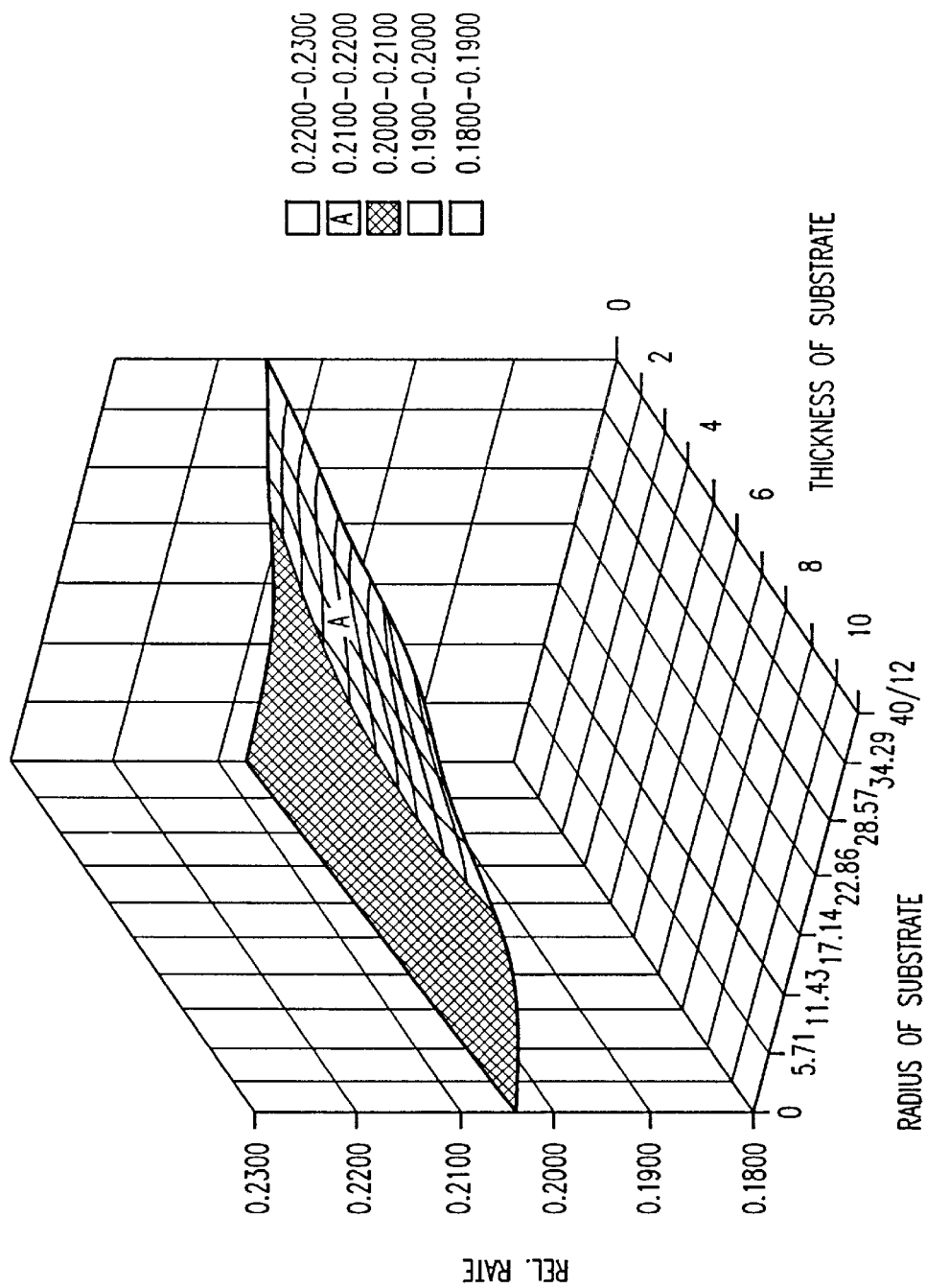
FIG. 5b is a diagram similar to that of FIG. 4b of the conditions during coating by a station according to the invention corresponding to FIG. 2.

The result s ar e illustrated in FIGS. 5a and 5b wherein here also, Kr. equals 0 for the conditions according to FIG. 1b.

When the results by way of the coating stations of the invention according to FIGS. 1 and 2, that is, according to FIGS. 4a and 5a, are compared with those of a station with a concave workpiece carrier planet arrangement according to the reference example, for example, according to John L. Vossen (FIG. 3a), it is found that, according to the invention, substrates with significantly larger radii and a significantly larger convex and concave curvature area can be coated with relative layer thicknesses of from 97.5% to 102.5%, thereby showing a significant improvement.

This also corresponds to the comparison of FIGS. 4b and 5b with FIG. 3b according to which, particularly according to FIG. 5b, the relative rate according to the present invention depends significantly less on the substrate radius and the substrate thickness than in the case of a coating with a concave planet arrangement according to the reference example.

Furthermore, the comparison of FIGS. 4a and 4b, implemented by the station according to the present invention according to FIG. 1, and of FIGS. 5a and 5b, implemented by that of FIG. 2, shows that the preferred implementation form according to FIG. 2 exhibits still better results. The radius area and curvature area according to FIG. 5a is still larger than according to FIG. 4a within which the coating thickness is in the range of from 97.5% to 102.5%. Furthermore, according to FIG. 5b, the coating rate is higher than according to FIG. 4b and depends even less on the radius and the thickness of the substrate.

As illustrated further by the comparison of FIGS. 4a and 5a (the present invention), on one hand, and FIG. 3a (the prior art reference example), on the other hand, the coating conditions for convex and concave coating surface curvatures, in the case of the approach of the former, are essentially symmetrical which results in significant advantages with respect to the flexibility of the usage of the station according to the present invention for the coating of convex and concave lens bodies.

The station having all these advantages is small, easily operable and permits coating in very small batches so that also persons not skilled in the art of coating (such as opticians) can implement individual coating formulas on individually curved substrates. This is also a result of the fact that the coating can be reproduced within narrow specification tolerances within wide limits irrespective of the target consumption of the sputter source.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A method for producing substrates with an optical layer thereon, comprising the steps of providing a sputter target arrangement, arranging said substrates on substrate carriers radially distant from a first axis perpendicularly to a sputtering surface, H, of said sputter target arrangement so that said first axis does not intersect said substrates, rotating said substrates around said first axis, additionally rotating said substrates around respective second axes at a distance from said first axis, thereby maintaining a distance, $D_1$, between areas of said substrates most distant from said first axis and said sputtering surface larger than a distance, $D_2$, between areas of said substrates closest to said first axis and said sputtering surface, providing at least one of said substrates on respective substrate carriers centered about said second axes, and further selecting the distance of the center of said substrate carriers to said sputtering surface, H, smaller than said distance of said second axes from said first axis which is designated by the letter R, selecting the ratio of R to a radius of substrate supports on said substrate carriers with respect to respective second axes, to be between 1.4 and 1.7, and depositing said optical layer on said substrates by sputtering from said sputter target arrangement.

2. The method of claim 1, thereby providing said first axis as a central axis of said sputtering surface and selecting said distance of said second axes from said first axis, R, to be at least equal to the maximum radial extent of said sputtering surface with respect to said first axis.

3. The method of claim 1, thereby selecting said first axis as a central axis of said sputtering surface and further selecting said distance R of said second axes from said first axis, R, to be at most equal to the maximum radial extent of said sputtering surface with respect to said first axis.

4. The method of claim 1, further comprising the step of arranging at least one of said substrates on respective substrate carriers centered about said second axes.

5. The method of claim 1, thereby selecting said second axes to be parallel to said first axis.

6. The method of claim 5, thereby selecting said first axis as a center axis of said sputtering surface and arranging respectively at least one of said substrates, on respective substrate carriers centered about said second axes, further selecting the sum of said distance of said second axes from said first axis and of a radius of said substrate carriers with respect to said second axes to be larger than the maximum radial extent of said sputtering surface with respect to said first axis.

7. The method of claim 1, thereby selecting said second axes to intersect one another and with said first axis in a sputtering area of said sputter target arrangement.

8. The method of claim 7, wherein said second axes intersect with said first axis at an angle of between 10° and 25°.

9. The method of claim 8, wherein said angle is at least approximately 15°.

10. The method of claim 1, comprising arranging at least one of said substrates on respective substrate carriers centered about said second axes and selecting the distance of the center of said substrate carriers to said sputtering surface to be between 50 and 100 mm.

11. The method of claim 10, wherein said distance is selected to be approximately 65 mm.

12. The method of claim 1, thereby selecting said ratio to be at least approximately 1.6.

13. The method of claim 1, further comprising the step of sputter depositing a multi-layer system on said substrates.

14. The method of claim 1, wherein said sputtering is selected to comprise reactive sputtering.

15. The method of claim 1, wherein said sputtering is performed in the metallic mode or in the "intramode".

16. The method of claim 1, wherein said sputtering is performed as magnetron sputter deposition.

17. The method of claim 1, wherein said sputtering is performed with a sputter source with chopper operation.

18. The method of claim 1, wherein said optical layers is selected to be an ophthalmic layer.

19. The method of claim 1, wherein said substrates are CD or semiconductor substrates.

20. The method of claim 1, wherein said substrates are of glass or a plastic material.

21. The method of claim 1, wherein said substrates are ophthalmic lenses.

22. The method of claim 1, wherein said substrates are optical lenses.

23. The method of claim 1, wherein a surface with said optical layer sputter deposited thereon has positive or negative curvature.

* * * * *